United States Patent
Kosaka et al.

(10) Patent No.: US 11,973,312 B2
(45) Date of Patent: Apr. 30, 2024

(54) SEMICONDUCTOR LASER DEVICE

(71) Applicant: Mitsubishi Electric Corporation, Tokyo (JP)

(72) Inventors: Naoki Kosaka, Tokyo (JP); Ayumi Fuchida, Tokyo (JP); Masaaki Shimada, Tokyo (JP); Go Sakaino, Tokyo (JP); Tadashi Takase, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 261 days.

(21) Appl. No.: 17/607,368

(22) PCT Filed: Jul. 2, 2019

(86) PCT No.: PCT/JP2019/026222
§ 371 (c)(1),
(2) Date: Oct. 28, 2021

(87) PCT Pub. No.: WO2021/001914
PCT Pub. Date: Jan. 7, 2021

(65) Prior Publication Data
US 2022/0224071 A1    Jul. 14, 2022

(51) Int. Cl.
*H04B 10/00*        (2013.01)
*H01S 5/0232*       (2021.01)
*H01S 5/026*        (2006.01)

(52) U.S. Cl.
CPC .......... *H01S 5/0232* (2021.01); *H01S 5/0262* (2013.01)

(58) Field of Classification Search
CPC .. H01S 5/0232; H01S 5/0262; H01S 5/02255; H01S 5/0239; H01S 5/0683;
(Continued)

(56) References Cited

U.S. PATENT DOCUMENTS

| 4,678,358 | A | * | 7/1987 | Layher | ................. | H01R 13/405 |
|           |   |   |        |        |                   | 65/59.32 |
| 6,074,102 | A | * | 6/2000 | Oikawa | ................. | G02B 6/4204 |
|           |   |   |        |        |                   | 385/88 |

(Continued)

FOREIGN PATENT DOCUMENTS

| JP | 2004-031595 A | 1/2004 |
| JP | 2004-319984 A | 11/2004 |

(Continued)

OTHER PUBLICATIONS

International Search Report issued in PCT/JP2019/026222; dated Aug. 6, 2019.

*Primary Examiner* — Agustin Bello
(74) *Attorney, Agent, or Firm* — Studebaker & Brackett PC

(57) ABSTRACT

A semiconductor laser device comprises a stem serving as a base; a laser diode LD submount having surface electrodes arranged thereon and joined to the surface of the stem; an LD chip joined to the surface electrode and connected with the surface electrode; and leads fixed in through holes formed in the stem by means of sealing parts and electrically connected to the surface electrodes via embedded layers in via holes formed in the LD submount, wherein grooves are formed in portions of the sealing parts or in portions of the LD submount around the connections between the leads and the embedded layers, to obtain a good modulated light waveform.

9 Claims, 12 Drawing Sheets

(58) Field of Classification Search
CPC ............ H01S 5/02345; H01S 5/06226; H01S 5/0237; H01S 5/02212; H01L 24/45; H01L 24/48; H01L 2224/45144; H01L 2224/48091; H01L 2224/48227; H01L 2924/12042; H01L 2924/12043; H01L 2924/15312; H01L 2924/181; H01L 2924/19107; H01L 24/00

See application file for complete search history.

(56) References Cited

U.S. PATENT DOCUMENTS

| | | | | |
|---|---|---|---|---|
| 7,154,126 | B2* | 12/2006 | Aruga | G02B 6/4279 257/432 |
| 8,053,803 | B2* | 11/2011 | Kimura | H01S 5/02212 257/781 |
| 9,159,634 | B2* | 10/2015 | Hettler | H01L 23/045 |
| 10,334,717 | B2* | 6/2019 | Noguchi | H05K 1/025 |
| 11,128,101 | B2* | 9/2021 | Hettler | H01L 23/10 |
| 2004/0060727 | A1* | 4/2004 | Kojima | G02B 6/4279 174/152 GM |
| 2004/0202432 | A1 | 10/2004 | Baek et al. | |
| 2005/0194601 | A1* | 9/2005 | Suenaga | H01L 33/62 257/81 |
| 2007/0065079 | A1* | 3/2007 | Mitamura | G02B 6/4283 385/94 |
| 2007/0120134 | A1* | 5/2007 | Oshima | H01S 5/02345 257/82 |
| 2010/0252856 | A1* | 10/2010 | Yuang | G02B 6/4201 257/E31.11 |
| 2014/0029900 | A1* | 1/2014 | Logan, Jr. | G02B 6/3821 29/874 |
| 2014/0217570 | A1* | 8/2014 | Hettler | H01L 23/08 438/106 |
| 2015/0116809 | A1* | 4/2015 | Uto | H01S 5/02208 359/245 |
| 2016/0141830 | A1* | 5/2016 | Kim | H01S 5/023 372/44.01 |
| 2018/0310397 | A1* | 10/2018 | Noguchi | H05K 1/141 |
| 2020/0064572 | A1* | 2/2020 | Hettler | H01S 5/02212 |
| 2020/0067265 | A1* | 2/2020 | Hettler | H01S 5/0233 |
| 2022/0224071 | A1* | 7/2022 | Kosaka | H01S 5/0232 |

FOREIGN PATENT DOCUMENTS

| | | |
|---|---|---|
| JP | 2004-342882 A | 12/2004 |
| JP | 2004-354642 A | 12/2004 |
| JP | 2007-042757 A | 2/2007 |
| JP | 2008-198934 A | 8/2008 |
| JP | 2010-212654 A | 9/2010 |
| JP | 2011-171649 A | 9/2011 |

* cited by examiner

SEMICONDUCTOR LASER DEVICE

TECHNICAL FIELD

The present application relates to a semiconductor laser device.

BACKGROUND ARTS

In a conventional semiconductor laser device, a laser diode chip (abbreviated as "LD chip" hereinafter) is implemented on a heatsink that perpendicularly protrudes from a metal base of a stem (see, for example, Patent Document 1). Furthermore, a semiconductor laser device is known that comprises a submount on a stem and a semiconductor laser element mounted on the submount for emitting a laser light parallel to the stem (see, for example, Patent Document 2).

A conventional semiconductor laser device receives a modulation signal superimposed on a direct current (DC) bias to drive the LD chip. The modulation signal is input to the LD chip via a gold wire and the submount to turn the laser light on and off in response to on and off of the square modulation signal. At this time, even though the signal input to the LD chip is an ideal square wave, a large impedance mismatch occurs due to parasitic inductances of the wires and the leads, whereby the modulated light waveform of the laser light emitted from the LD chip has a longer rise time and a longer fall time, thus resulting in deterioration of the waveform. A severe deterioration of the waveform results in that on and off of the light signal are indistinguishable to the receiver side, thus causing difficulty in demodulating the signal. In particular, the higher the modulation frequency, the larger the influence of impedance mismatch, whereby the light waveform deteriorates largely. While the degree of light modulation increases at a frequency fr by being subject to the influence of relaxation oscillation of the semiconductor laser chip, the degree of light modulation decreases as the modulation frequency increases higher. With a frequency fc at which the degree of light modulation lowers by 1.5 dB from that of light modulation in lower modulation frequencies and with times tr, tf required for the modulated light waveform to rise from 10% to 90% and to fall from 90% to 10%, respectively, the relationship between fc, and tr and tf is given by the following expression:

$$tr = tf = 0.35/fc.$$

Thus, increasing the frequency fc shortens the times tr, tf and enables a good modulated light waveform to be obtained. To improve the modulated light waveform, it is effective to prevent the impedance mismatch by reducing the parasitic inductances and to increase the frequency fc.

PRIOR ART DOCUMENTS

Patent Documents

Patent Document 1: JP2004-342882A (paragraph [0026] and FIG. 1); and
Patent Document 2: JP2008-198934A (paragraph [0022] and FIG. 1).

SUMMARY OF THE INVENTION

Problem that the Invention is to Solve

To reduce the parasitic inductance, it is effective to shorten the leads and the gold wire. However, the conventional structures as disclosed in Patent Document 1 and Patent Document 2 need to extend the leads and the wire to the position of the chip, thus posing a problem of causing deterioration of the modulated light waveform due to the long leads and the gold wires. Furthermore, although mounting the LD chip at a position closer to the upper surface of the stem allows for shortening the leads and the gold wires, using a general assembly equipment for a semiconductor laser device causes interference between a vacuum collet for picking up the chip and the stem when implementing the chip, thus posing a problem of impracticability.

The present application discloses a technology for resolving the above-described problems and aims at providing a semiconductor laser device that reduces usage of the wires to obtain a good modulated light waveform and also allows for easily implementing the chip.

Means for Solving the Problem

A semiconductor laser device disclosed in the present application comprises a stem serving as a base; a submount having electrodes provided on a surface of the submount and joined to the stem; a semiconductor laser element connected to the electrodes; and leads fixed to through holes formed in the stem by means of sealing parts and connected to the electrodes, wherein grooves are formed in portions of the sealing parts or in portions of the submount around the leads on a joint side of the stem and the LD submount.

Advantageous Effect of the Invention

According to the present application, not only a parasitic inductance can be reduced by reducing usage of the wires and a good modulated light waveform can be obtained thereby, but also the chip can be easy to implement.

DETAILED DESCRIPTION OF THE INVENTION

Embodiment 1

Figure 1:
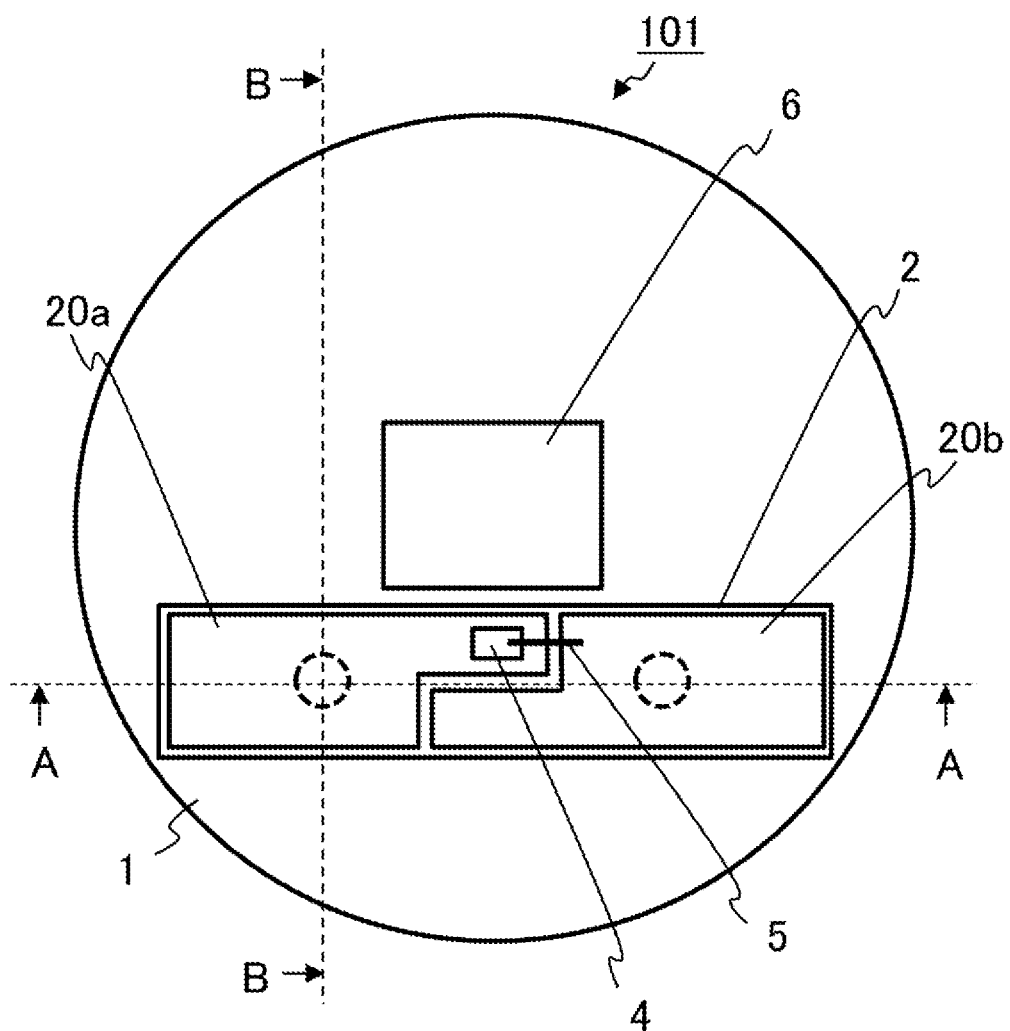
FIG. 1 is a plan view showing a configuration of a semiconductor laser device according to Embodiment 1.
Figure 2:
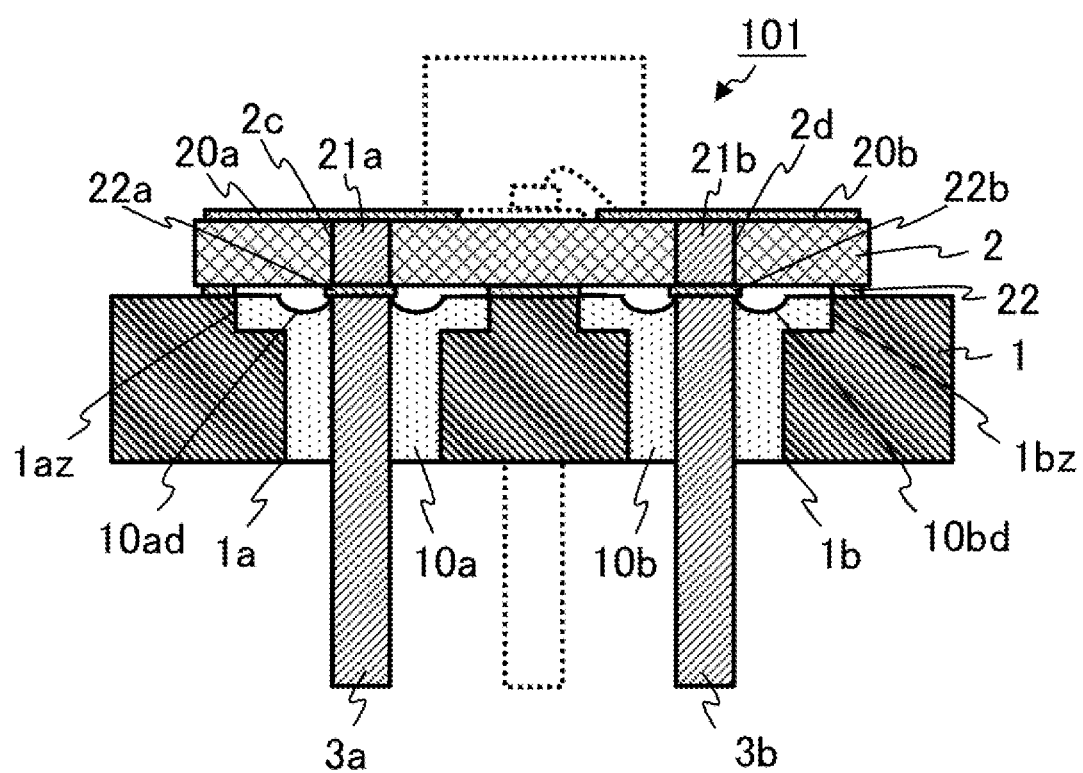
FIG. 2 is a sectional view showing the configuration of the semiconductor laser device according to Embodiment 1.
Figure 3:
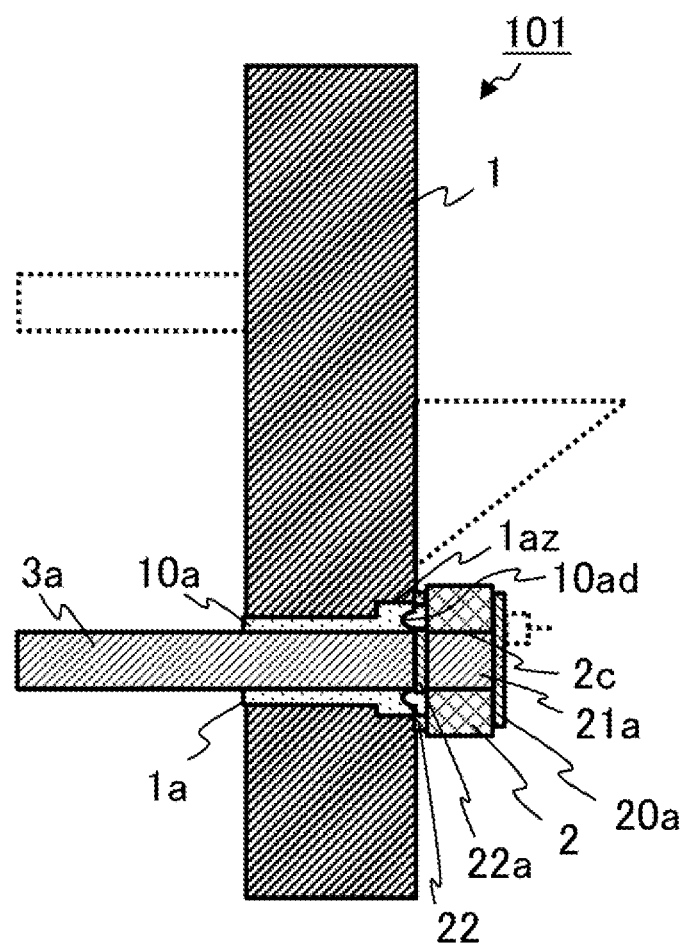
FIG. 3 is another sectional view showing the configuration of the semiconductor laser device according to Embodiment 1.

FIG. 1 is a plan view showing a configuration of a semiconductor laser device 101 according to Embodiment 1 of the present application. FIG. 2 is a sectional view taken in the direction of the arrows along the line A-A of FIG. 1, and FIG. 3 is a sectional view taken in the direction of the arrows along the line B-B of FIG. 1. With reference to FIG. 1 to FIG. 3, the semiconductor laser device 101 comprises a stem 1 serving as a base; an LD submount 2 mounted on the surface of the stem 1; leads 3a, 3b fixed in the through holes 1a, 1b formed in the stem 1 and electrically connected to surface electrodes 20a, 20b on the LD submount 2 via conductive embedded layers 21a, 21b in via holes 2c, 2d and back electrodes 22a, 22b, respectively; an LD chip 4, which is a semiconductor laser element, joined to the surface of the surface electrode 20a on the LD submount 2; a gold wire 5 connecting the top surface electrode of the LD chip 4 to the surface electrode 20b; and a mirror 6 for reflecting the laser light emitted from the LD chip 4.

The stem 1 is the base of the semiconductor laser device 101 and has the through holes 1a, 1b formed therein for passing the leads 3a, 3b, respectively. The leads 3a, 3b are fixed in the through holes 1a, 1b by means of sealing parts 10a, 10b made of a material such as glass.

The LD submount 2 is mounted on the stem 1 by soldering, and the LD chip 4 is implemented on the surface electrode 20a. The top surface electrode of the LD chip 4 is connected to the surface electrode 20b by the gold wire 5. The surface electrodes 20a, 20b on the LD submount 2 are connected to the back electrodes 22a, 22b via the embedded layers 21a, 21b in the via holes 2c, 2d, respectively.

The leads 3a, 3b are respectively fixed in the through holes 1a, 1b formed in the stem 1 by means of sealing parts 10a, 10b made of the material such as glass. The top ends of the leads 3a, 3b are flush with the upper surface of the stem 1 and connected with the back electrodes 22a, 22b and to the surface electrodes 20a, 20b of the LD submount 2 by soldering via the embedded layers 21a, 21b, respectively.

The LD chip 4 is joined to the surface electrode 20a on the LD submount 2 via the bottom surface electrode of the LD chip 4 such as by soldering. The top surface electrode of the LD chip 4 is connected to the surface electrode 20b on the LD submount 2 by the gold wire 5.

The mirror 6 is mounted on the upper surface of the stem 1 to reflect in the direction perpendicular to the stem 1 the laser light emitted from the LD chip 4. The mirror may be an optical part such as a prism and may also be a photodiode chip (abbreviated as "PD chip" hereinafter) coated with a high reflection film.

Here, a structural feature of the semiconductor laser device 101 of the present application is described. The feature of the semiconductor laser device 101 is that the surface electrodes 20a, 20b on the LD submount 2, which are connected with the LD chip 4, are electrically connected to the back electrodes 22a, 22b via the embedded layers 21a, 21b in the via holes 2c, 2d; the through holes 1a, 1b in the stem 1 for fixing the leads 3a, 3b to be connected with the back electrodes 22a, 22b have counterbores 1az, 1bz formed opposite to the LD submount 2; and grooves 10ad, 10bd are formed in portions around the leads 3a, 3b, of the sealing parts 10a, 10b in the counterbores 1az, 1bz opposite to the LD submount 2. Note that no back electrodes 22, 22a, 22b are formed in areas 2a, 2b opposite to the sealing parts 10a, 10b, of the LD submount 2.

Figure 4A:
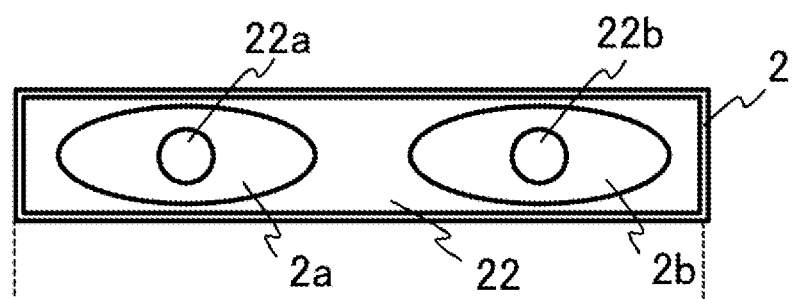
FIGS. 4A and 4B are views illustrating a step of implementing a submount used in the semiconductor laser device according to Embodiment 1.
Figure 4B:
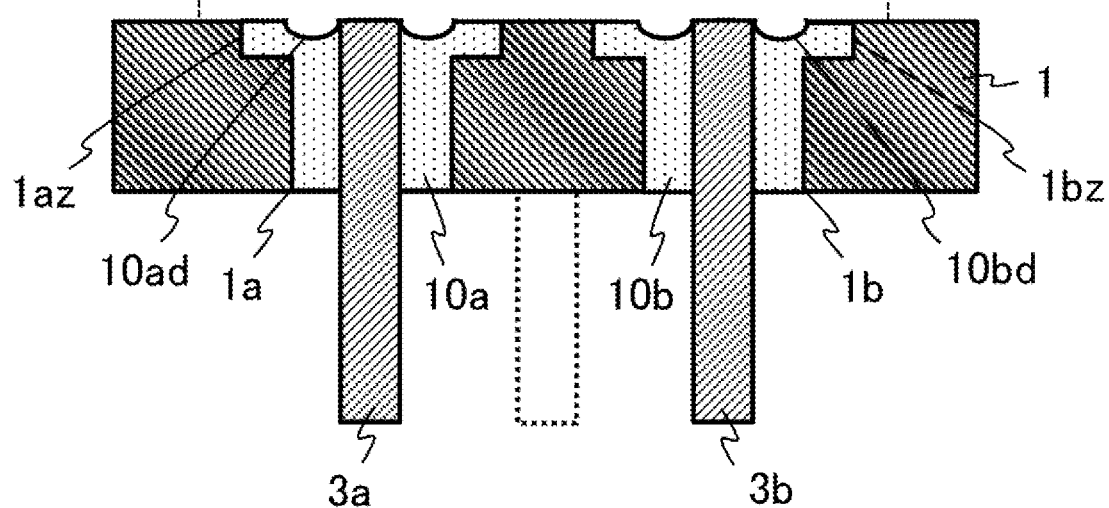

FIGS. 4A and 4B are a bottom view (FIG. 4A) of the LD submount 2 used for the semiconductor laser device 101 according to Embodiment 1, and a sectional view (FIG. 4B) of the stem 1 with the leads 3a, 3b being fixed thereto. The leads 3a, 3b and the back electrodes 22a, 22b, and the stem 1 and back electrode 22 are joined to each other by soldering in the manufacturing step of implementing the LD submount 2 on the stem 1.

At this time, if the back electrodes 22a, 22b and the leads 3a, 3b are positionally misaligned with each other and too much amount of solder is used for the joining, the solder largely spreads and comes into contact with the stem 1, thus leading to a short circuit failure. To prevent such a failure, it is necessary to precisely control the positional alignment between the back electrodes 22a, 22b and the leads 3a, 3b and the amount of solder; however, this brings difficulty in the manufacturing. Hence, the present application employs a structure such that grooves 10ad, 10bd are formed in the portions around the leads 3a, 3b, of the sealing parts 10a, 10b to facilitate the manufacturing without causing such a short circuit failure.

This structure allows for reducing the failure due to contact of the stem 1 with the solder spreading when the LD submount 2 is joined to the stem 1. In addition, spread of the solder can be prevented by forming grooves in portions of the back side of the LD submount 2 around the back electrodes 22a, 22b connected to the leads. Furthermore, the top ends of the leads may be lowered by the thickness of the solder from the upper surface of the stem 1 without being flush with the upper surface of the stem.

As described above, the semiconductor laser device 101 according to Embodiment 1 comprises the stem 1 serving as the base; the LD submount 2 having the surface electrodes 20a, 20b provided thereon and joined to the surface of the stem 1; the LD chip 4 joined to the surface electrode 20a and connected with the surface electrode 20b; and the leads 3a, 3b fixed in the through holes 1a, 1b formed in the stem 1 by means of the sealing parts 10a, 10b and electrically connected to the surface electrodes 20a, 20b via the embedded layers 21a, 21b in the via holes 2c, 2d formed in the LD submount 2, wherein grooves 10ad, 10bd are formed in the portions of the sealing parts 10a, 10b or in the portions of the LD submount 2 around the connections between the leads 3a, 3b and the embedded layers 21a, 21b and on the joint side of the stem 1 and the LD submount 2. Hence, the semiconductor laser device eliminates the need for the use such as of long leads having a large parasitic inductance as used in conventional semiconductor laser devices, and the modulated light waveform can be improved and a good modulated light waveform can be obtained by reducing usage of the wires. Moreover, the chip can be easy to implement.

Embodiment 2

While Embodiment 1 described the case of connecting the surface electrodes 20a, 20b to the leads 3a, 3b via the embedded layers 21a, 21b in the via holes 2c, 2d, Embodiment 2 describes a case of connecting the surface electrodes 20a, 20b with the leads 3a, 3b by direct contact.

Figure 5:
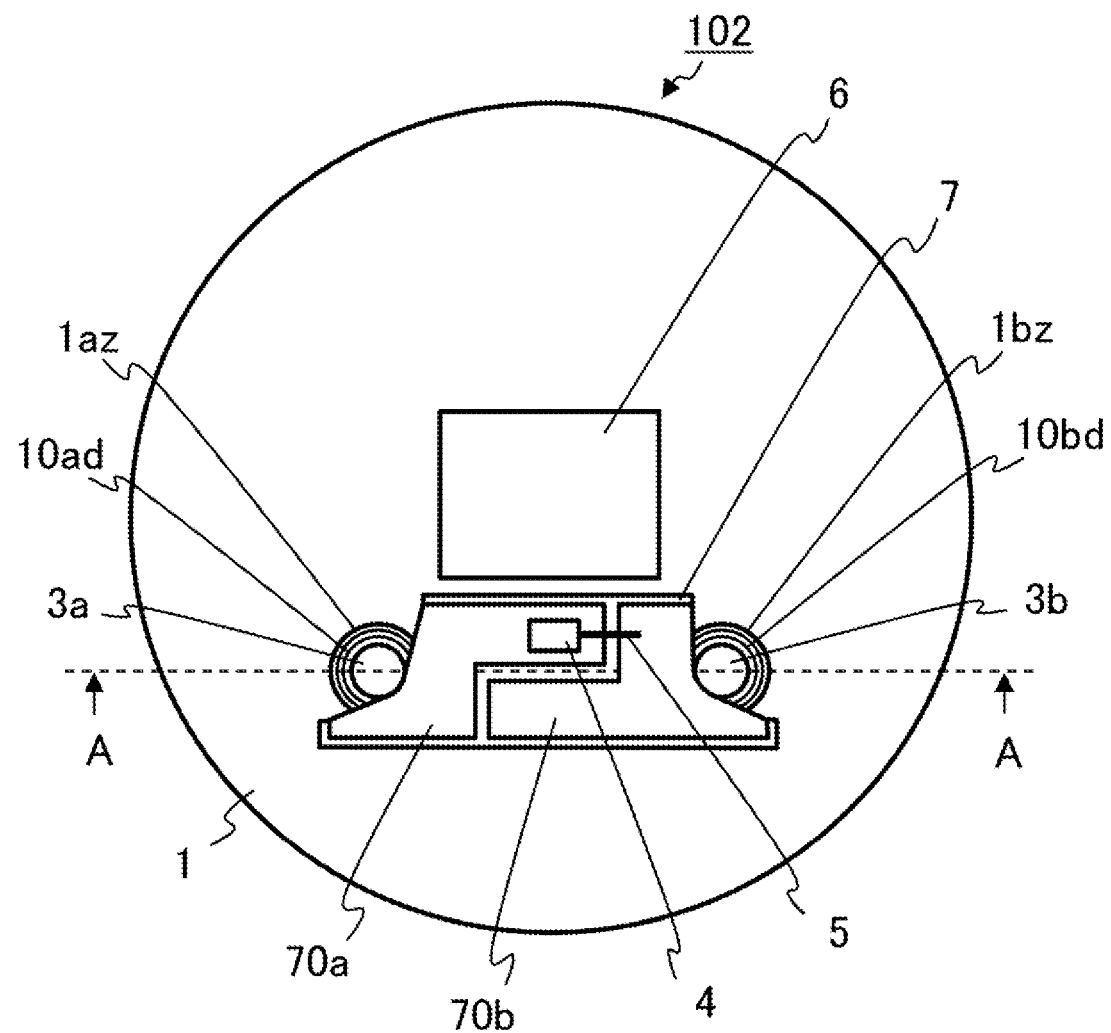
FIG. 5 is a plan view showing a configuration of a semiconductor laser device according to Embodiment 2.
Figure 6:
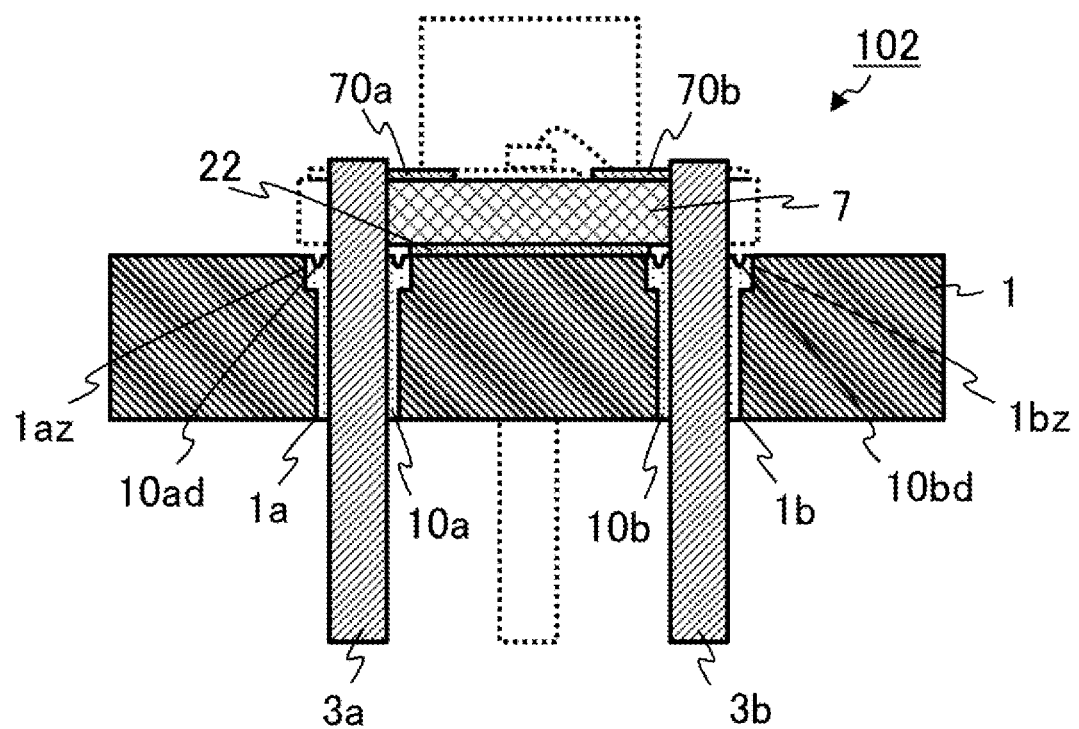
FIG. 6 is a sectional view showing the configuration of the semiconductor laser device according to Embodiment 2.

FIG. 5 is a plan view showing a configuration of a semiconductor laser device 102 according to Embodiment 2 of the present application. FIG. 6 is a sectional view taken in the direction of arrows along the line A-A of FIG. 5. As shown in FIGS. 5 and 6, the semiconductor laser device 102 has leads 3a, 3b that protrude from the surface of the stem 1 into direct contact with surface electrodes 70a, 70b on an LD submount 7 that is formed by cutting two corners of the LD submount 2 used in Embodiment 1, to be electrically connected with the surface electrodes 70a, 70b by soldering without via the embedded layers in the via holes, respectively. The top ends of the leads 70a, 70b may be expanded or constricted as appropriate to facilitate soldering. In addition, gold wires or gold tapes may be used instead of soldering.

Moreover, the grooves are formed in portions of the sealing parts 10a, 10b or in portions of the LD submount 7 around the leads 3a, 3b and on the joint side of the stem 1 and the LD submount 7. The configuration of the other components of the semiconductor laser device 102 according to Embodiment 2 is the same as that of the components of the semiconductor laser device 101 of Embodiment 1, and the same reference numerals are assigned to corresponding ones and their descriptions are omitted.

As described above, the semiconductor laser device 102 according to Embodiment 2 comprises the stem 1 serving as the base; the LD submount 7 having the surface electrodes 70a, 70b provided thereon and joined to the surface of the stem 1; the LD chip 4 joined to the surface electrode 70a and connected with the surface electrode 70b; and the leads 3a, 3b fixed in the through holes 1a, 1b formed in the stem 1 by means of the sealing parts 10a, 10b and electrically connected to the surface electrodes 70a, 70b by contact therewith, wherein grooves 10ad, 10bd are formed in the portions of the sealing parts 10a, 10b or in the portions of the LD submount 7 around the leads 3a, 3b on the joint side of the stem 1 and LD submount 7. Hence, by reducing usage of the wires having a large parasitic inductance as used in conventional semiconductor laser devices, the modulated light waveform can be improved and a good modulated light waveform can be obtained. Moreover, the chip can be easy to implement.

Figure 7:
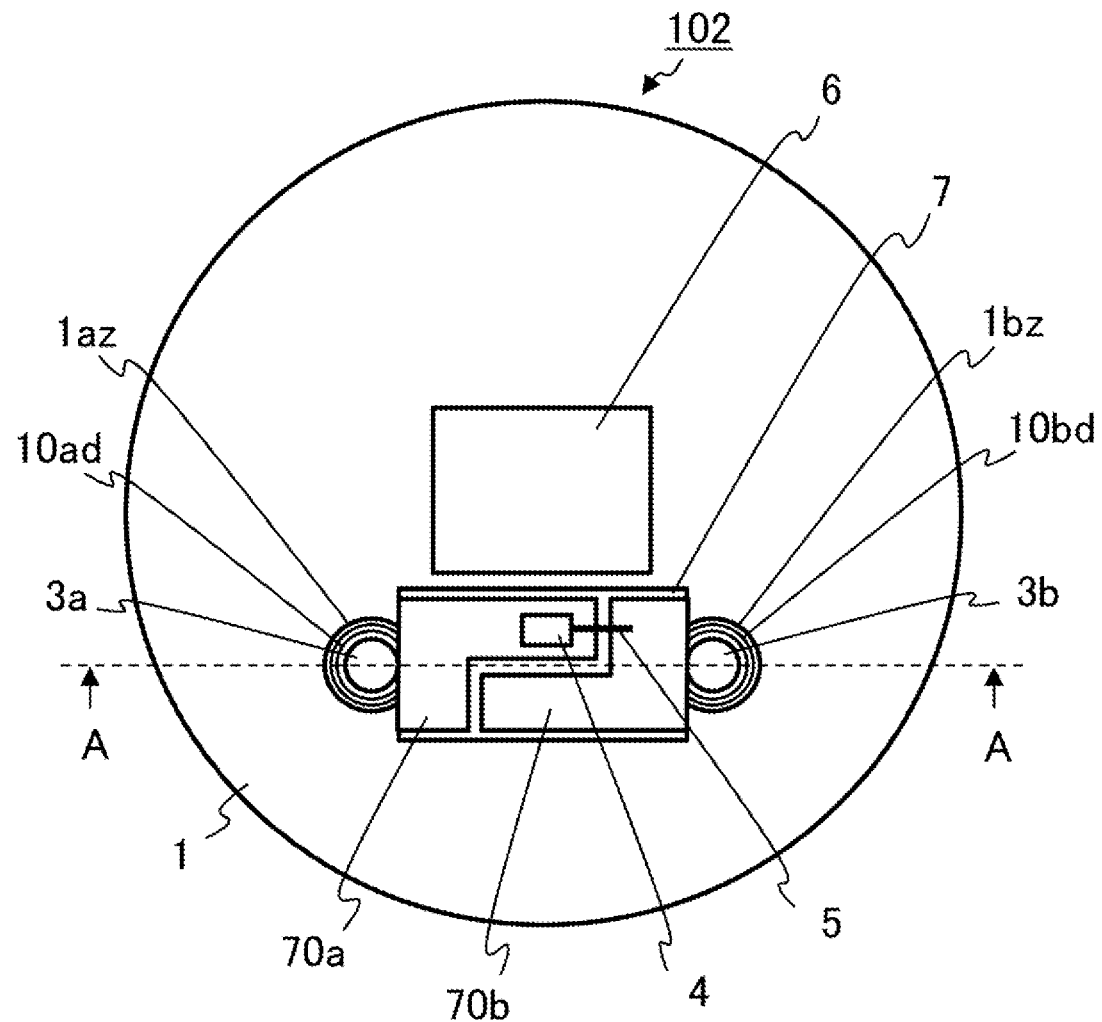
FIG. 7 is a plan view showing a configuration of a semiconductor laser device according to Embodiment 2.
Figure 8:
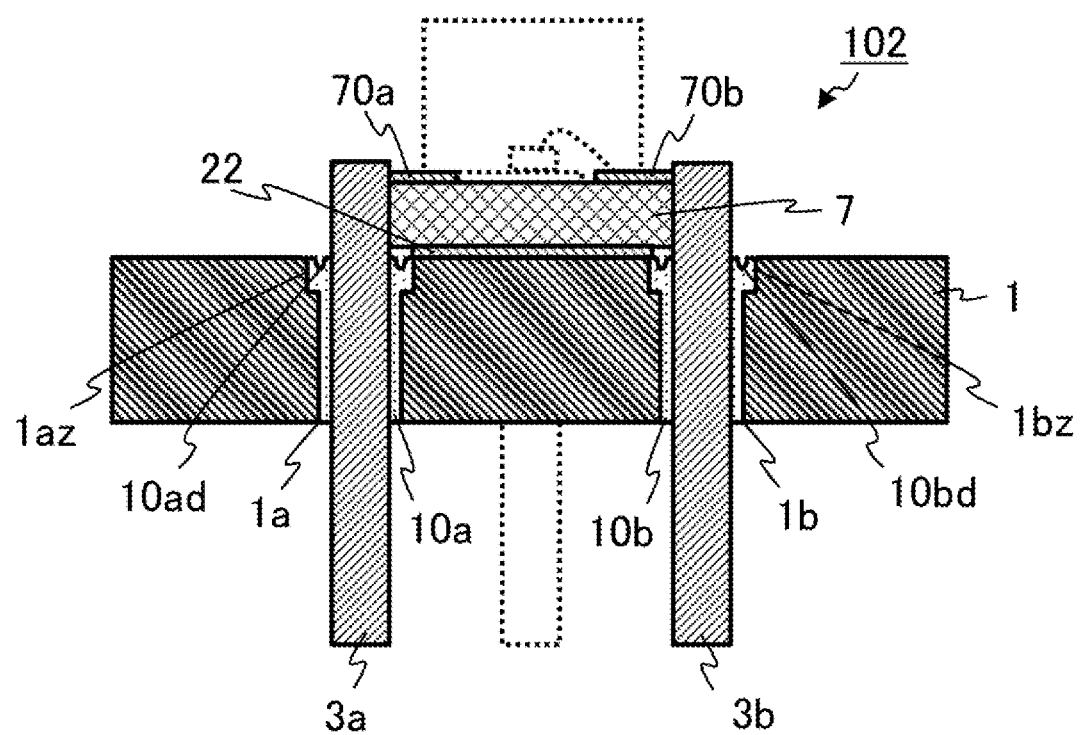
FIG. 8 is a sectional view showing the configuration of the semiconductor laser device according to Embodiment 2.

Note that the shape of the LD submount 7 of the semiconductor laser device 102 according to Embodiment 2 is not limited to this. A rectangular LD submount 7 whose both short lateral sides are cut flat may be used. FIG. 7 is a plan view showing another configuration of the semiconductor laser device 102 according to Embodiment 2. FIG. 8 is a sectional view taken in the direction of the arrows along the line A-A of FIG. 7. Using the rectangular LD submount can also exhibit the same effect as that described above.

Embodiment 3

Embodiment 3 describes a case of mounting a PD chip for monitoring the output of the laser light emitted from the LD chip 4.

Figure 9:
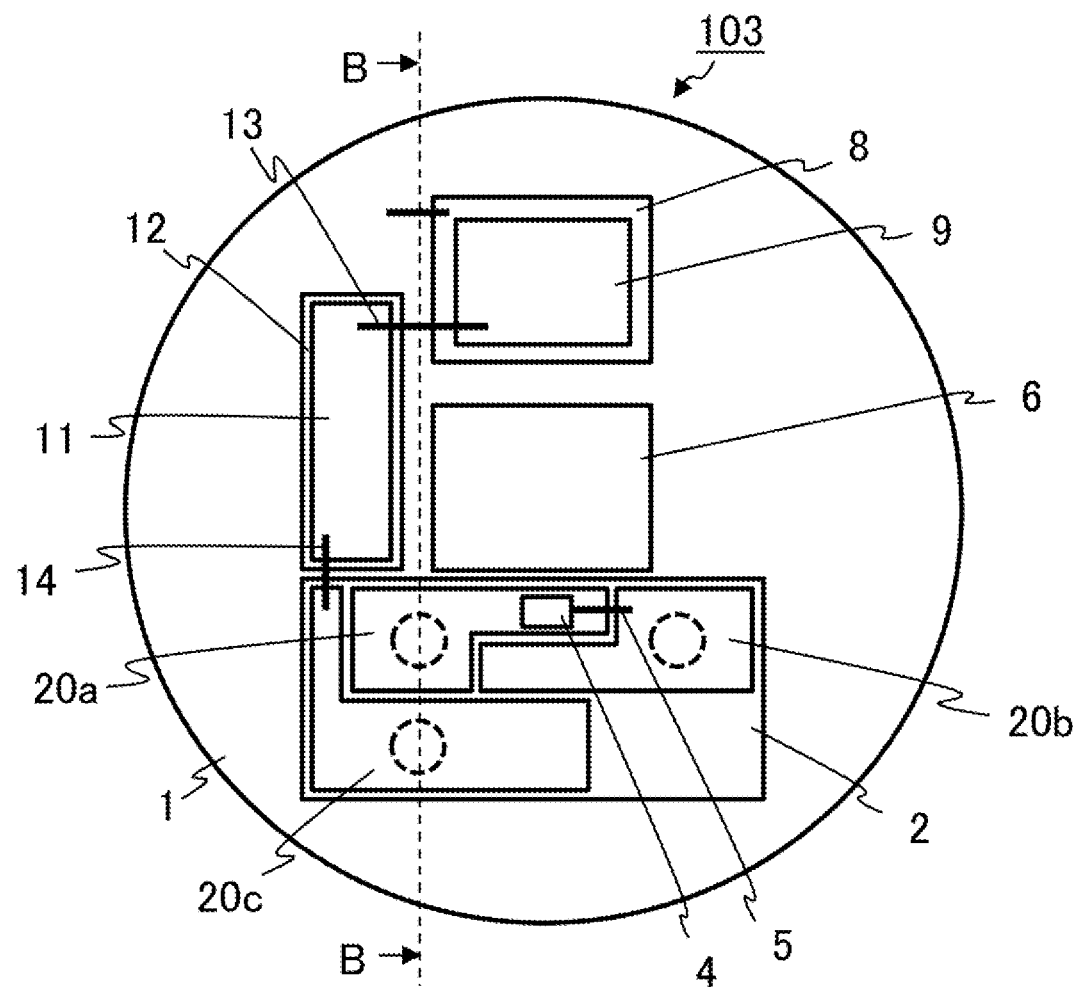
FIG. 9 is a plan view showing a configuration of a semiconductor laser device according to Embodiment 3.
Figure 10:
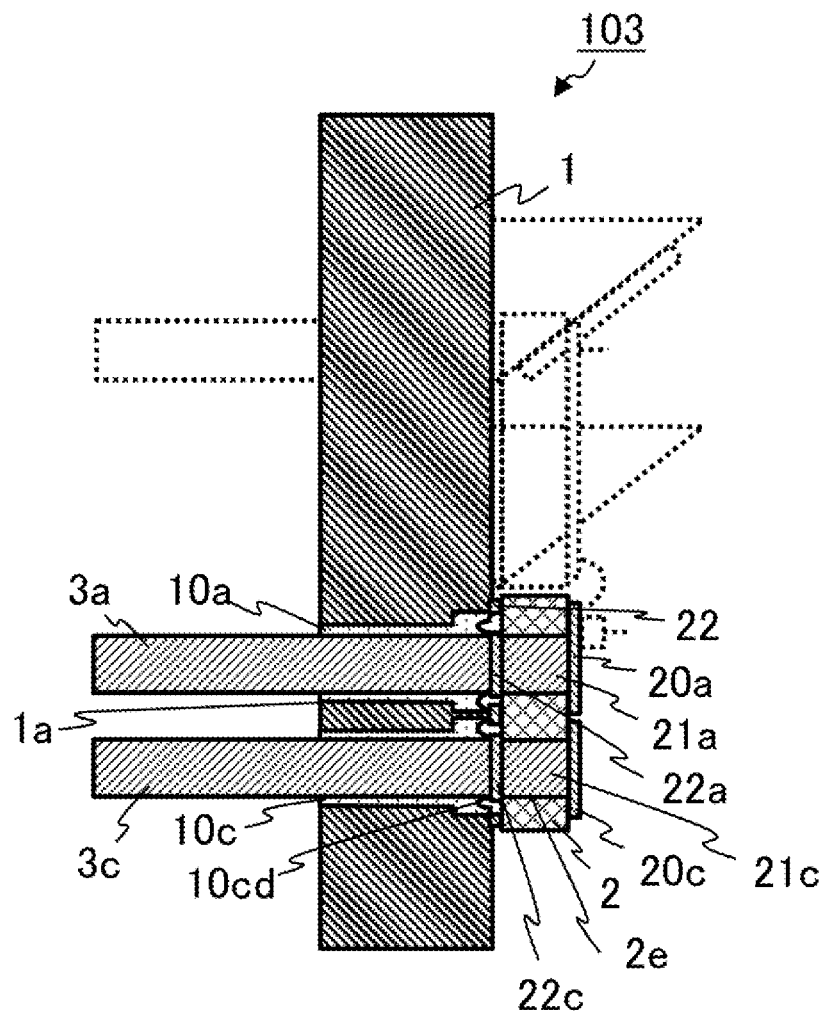
FIG. 10 is a sectional view showing the configuration of the semiconductor laser device according to Embodiment 3.

FIG. 9 is a plan view showing a configuration of a semiconductor laser device 103 according to Embodiment 3 of the present application. FIG. 10 is a sectional view taken in the direction of arrows along the line B-B of FIG. 9.

In general semiconductor laser devices, an LD chip is mounted so as to emit its laser light in the direction perpendicular to the stem without using a mirror, and a PD chip is implemented perpendicularly to the LD chip (parallel to the stem) to receive a light leaking from the rear side of the LD chip in order to monitor the output of the laser light. However, it is difficult to ensure a space for mounting the PD chip perpendicularly to and behind the LD chip 4 in the configuration of Embodiment 1.

Hence, as shown in FIGS. 9 and 10, the semiconductor laser device 103 has a PD chip 9, which is a photodiode element, and a PD submount 8 both mounted behind the mirror 6 for the PD chip 9 to receive part of the laser light emitted from the LD chip 4 and passing through the mirror 6. The PD chip 9 receiving the part of the laser light sends an electrical signal to a lead 3c via a gold wire 13, a surface electrode 11 on an intermediary base plate 12, a gold wire 14, and a routing pattern 20c that is a surface electrode on an LD submount 2. The configuration of the other components of the semiconductor laser device 103 according to Embodiment 3 is the same as that of the components of the semiconductor laser device 101 of Embodiment 1, and the same reference numerals are assigned to corresponding ones and their descriptions are omitted.

As described above, the semiconductor laser device 103 according to Embodiment 3 comprises the PD chip 9 mounted behind the mirror 6 for receiving the part of laser light passing through the mirror 6, wherein the PD chip 9 is electrically connected to the lead 3c by way of the surface electrode 20c on the LD surmount 2 and via an embedded layer 21c in a via hole 2e and a back electrode 22c, wherein groove 10cd is formed in a portion of the sealing part 10c or in a portion of the LD submount 2 around the connection between the leads 3c and the embedded layer 21c and on the joint side of the stem 1 and the LD submount 2. Hence, the semiconductor laser device eliminates the need for the use such as of long leads having a large parasitic inductance as used in conventional semiconductor laser devices in detecting the laser light emitted from the LD chip by the PD chip to monitor the output of the laser light, and the modulated light waveform can be improved and a good modulated light waveform can be obtained by reducing usage of the wires. Moreover, the chip can be easy to implement.

Figure 11:
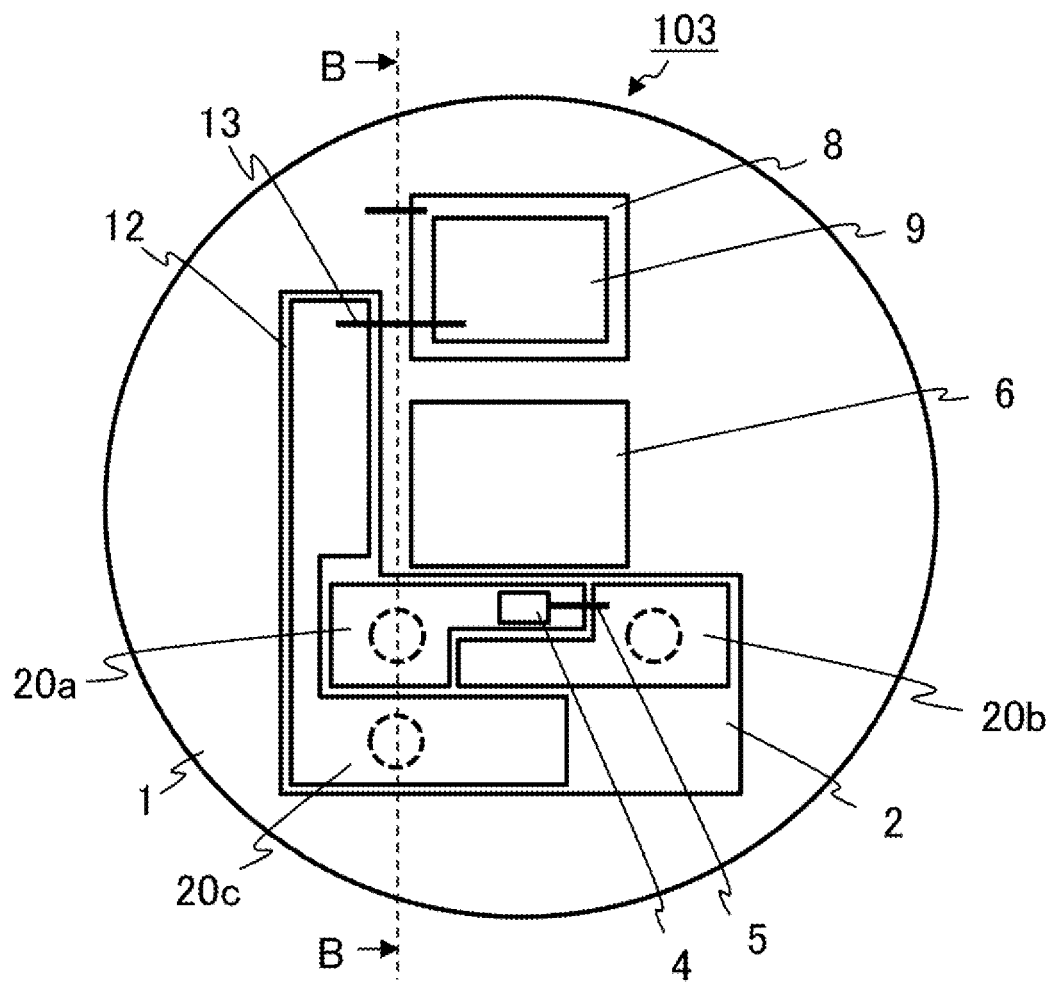
FIG. 11 is a plan view showing a configuration of a semiconductor laser device according to Embodiment 3.
Figure 12:
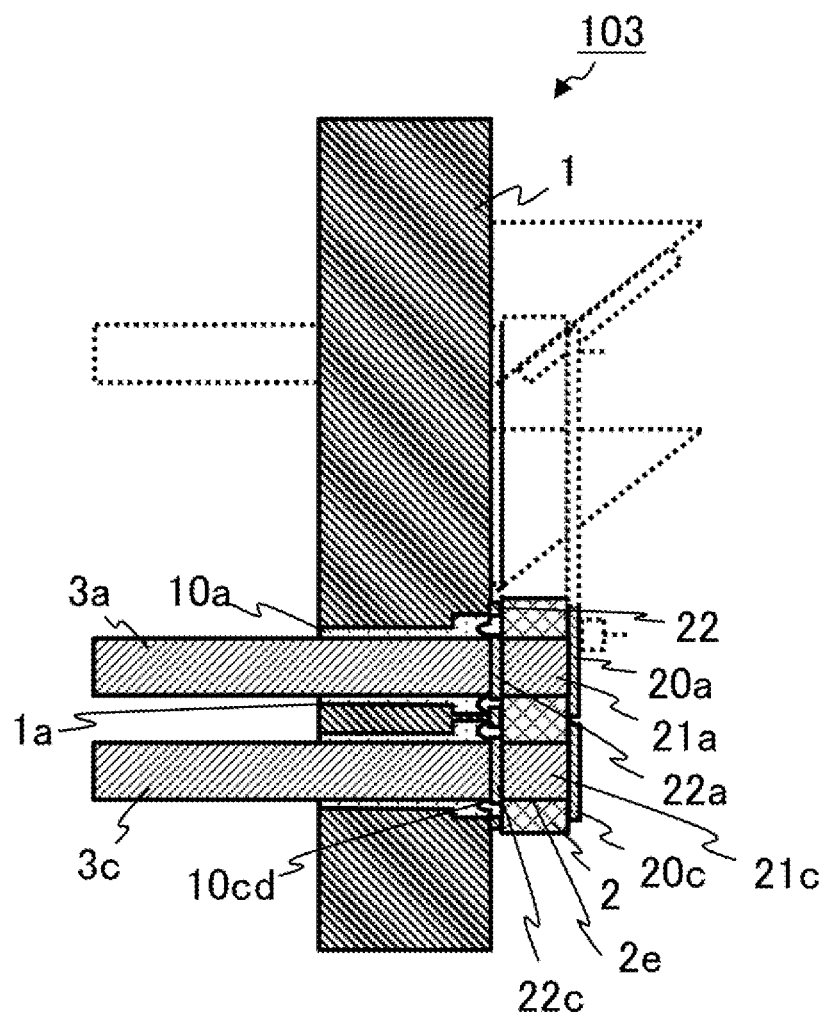
FIG. 12 is a sectional view showing the configuration of the semiconductor laser device according to Embodiment 3.

While in the semiconductor laser device 103 according to Embodiment 3, the connection between the surface electrode 11 on the intermediary base plate 12 and the routing pattern 20c is established by the gold wire 14, the connection is not limited to this. The intermediary base plate and the LD submount may be formed in one piece to form the surface electrode on the intermediary base plate and the routing pattern (FIG. 11 and FIG. 12). This connection can also exhibit obtain the same effect as that described above.

Although the present application describes various exemplary embodiments and implementations, it should be understood that various features and aspects and functionalities described in one or more of the individual embodiments are not limited to their applicability to the specific embodiment but instead can be applied alone or in various combinations to one or more of the embodiments. Therefore, numerous modifications that have not been exemplified are conceivable without departing from the technical scope disclosed in the specification of the present application. For example, at least one of the constituent components may be modified, added, or eliminated, and further at least one of the constituent components mentioned in at least one of the preferred embodiments may be selected and combined with the constituent elements mentioned in another preferred embodiment.

REFERENCE NUMERALS

1: stem;
1a, 1b: through hole;
2, 7: LD submount;
2c, 2d: via hole;
3a, 3b: lead;

4: LD chip;
10a, 10b: sealing part;
10ad, 10bd: groove;
20a, 20b: surface electrode;
21a, 21b: embedded layer;
22a, 22b: back electrode;
70a, 70b: surface electrode; and
101, 102, 103: semiconductor laser device.

The invention claimed is:

1. A semiconductor laser device comprising:
a stem serving as a base;
a submount having electrodes provided on a surface of the submount and joined to the stem;
a semiconductor laser element connected to the electrodes; and
leads fixed to through holes formed in the stem by means of sealing parts and connected to the electrodes, wherein
grooves are formed in portions of the sealing parts or in portions of the submount around the leads on a joint side of the stem and the submount, and outer circumferences of the grooves are spaced from the stem.

2. A semiconductor laser device comprising:
a stem serving as a base;
a submount having electrodes provided on a surface of the submount and joined to the stem;
a semiconductor laser element connected to the electrodes; and
leads fixed to through holes formed in the stem by means of sealing parts and connected to the electrodes, wherein
grooves are formed in portions of the sealing parts or in portions of the submount around the leads on a joint side of the stem and the submount, and
the leads are electrically connected to the electrodes via metal buried layers in via holes formed in the submount.

3. The semiconductor laser device according to claim 1, wherein the leads are contact with and electrically connected to the electrodes, respectively.

4. The semiconductor laser device according to claim 1, further comprising:
a mirror configured to reflect a laser light emitted from the semiconductor laser element; and
a photodiode element mounted behind the mirror and configured to receive part of the laser light passing through the minor,
wherein the photodiode element is connected to another lead via another electrode.

5. The semiconductor laser device according to claim 2, further comprising:
a mirror configured to reflect a laser light emitted from the semiconductor laser element; and
a photodiode element mounted behind the mirror and configured to receive part of the laser light passing through the minor,
wherein the photodiode element is connected to another lead via another electrode.

6. The semiconductor laser device according to claim 3, further comprising:
a mirror configured to reflect a laser light emitted from the semiconductor laser element; and
a photodiode element mounted behind the mirror and configured to receive part of the laser light passing through the minor,
wherein the photodiode element is connected to another lead via another electrode.

7. The semiconductor laser device according to claim 1, wherein the stem further comprises an upper surface and the submount further comprises a lower surface opposite to the surface on which the electrodes are provided facing the upper surface such that the upper surface and the lower surface are parallel.

8. The semiconductor laser device according to claim 1, further comprising:
counterbores positioned in the stem opposite to the submount and including the sealing parts, wherein the grooves are formed in the portions of the sealing parts in the counterbores.

9. The semiconductor laser device according to claim 1, wherein upper surfaces of ends of the leads at the sides thereof fixed to the through holes are flush with, or spaced inwardly in the stem from, an upper surface of the stem facing the submount.

* * * * *